(12) United States Patent
Komatsu et al.

(10) Patent No.: US 10,916,698 B2
(45) Date of Patent: Feb. 9, 2021

(54) SEMICONDUCTOR STORAGE DEVICE INCLUDING HEXAGONAL INSULATING LAYER

(71) Applicant: TOSHIBA MEMORY CORPORATION, Tokyo (JP)

(72) Inventors: Katsuyoshi Komatsu, Yokkaichi Mie (JP); Takeshi Iwasaki, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/523,394

(22) Filed: Jul. 26, 2019

(65) Prior Publication Data

US 2020/0243763 A1 Jul. 30, 2020

(30) Foreign Application Priority Data

Jan. 29, 2019 (JP) .................................. 2019-013343

(51) Int. Cl.
 *G11C 11/00* (2006.01)
 *H01L 45/00* (2006.01)
 *G11C 13/00* (2006.01)
(52) U.S. Cl.
 CPC ........ *H01L 45/1233* (2013.01); *G11C 13/004* (2013.01); *G11C 13/0004* (2013.01); *H01L 45/06* (2013.01)

(58) Field of Classification Search
 CPC .................................................. G11C 13/0002
 USPC .......................................................... 365/148
 See application file for complete search history.

(56) References Cited

U.S. PATENT DOCUMENTS

| 8,575,589 | B2 | 11/2013 | Nagashima |
| 9,070,578 | B2 | 6/2015 | Despont |
| 9,349,802 | B2 | 5/2016 | Heo |
| 9,425,237 | B2 | 8/2016 | Jo |
| 2011/0310653 | A1 | 12/2011 | Kreupl |
| 2014/0003127 | A1 | 1/2014 | Sakamoto |
| 2014/0166969 | A1 | 6/2014 | Tendulkar |
| 2016/0064666 | A1 | 3/2016 | Chan |
| 2016/0254448 | A1* | 9/2016 | Choi ................... H01L 45/1253 257/4 |
| 2017/0244026 | A1* | 8/2017 | Wu ....................... H01L 45/126 |

(Continued)

FOREIGN PATENT DOCUMENTS

| JP | 2011-018838 A | 1/2011 |
| JP | 2013-534724 A | 9/2013 |

(Continued)

*Primary Examiner* — Hoai V Ho
(74) *Attorney, Agent, or Firm* — Foley & Lardner LLP (57) ABSTRACT

A semiconductor storage device is disclosed. The device includes: a first conductive layer; a second conductive layer apart from the first conductive layer in a first direction; a variable resistance layer provided between the first conductive layer and the second conductive layer; a third conductive layer provided between the first conductive layer and the variable resistance layer; a nonlinear layer provided between the first conductive layer and the third conductive layer; and a first insulating layer provided at least between the first conductive layer and the nonlinear layer or between the third conductive layer and the nonlinear layer. The first insulating layer includes nitrogen (N) and boron (B).

7 Claims, 4 Drawing Sheets

(56) References Cited

U.S. PATENT DOCUMENTS

2018/0006216 A1   1/2018  Kamata
2018/0204881 A1   7/2018  Sei
2019/0244661 A1*  8/2019  Kim ..................... G11C 13/004

FOREIGN PATENT DOCUMENTS

JP        2014-011391 A     1/2014
WO    WO-2016/158430 A1   10/2016

* cited by examiner

SEMICONDUCTOR STORAGE DEVICE INCLUDING HEXAGONAL INSULATING LAYER

CROSS-REFERENCE TO RELATED APPLICATION(S)

This application is based upon and claims the benefit of priority from Japanese Patent Application No. 2019-013343, filed Jan. 29, 2019, the entire contents of which are incorporated herein by reference.

FIELD

Embodiments described herein relate generally to semiconductor storage devices.

BACKGROUND

A semiconductor storage device including a first conductive layer, a second conductive layer apart from the first conductive layer in a first direction, a variable resistance layer provided between the first conductive layer and the second conductive layer, a third conductive layer provided between the first conductive layer and the variable resistance layer, and a nonlinear layer provided between the first conductive layer and the third conductive layer is known. Examples of related art include JP-A-2011-018838.

DETAILED DESCRIPTION

Embodiments provide a suitably controllable semiconductor storage device.

In general, according to one embodiment, a semiconductor storage device includes: a first conductive layer; a second conductive layer apart from the first conductive layer in a first direction; a variable resistance layer provided between the first conductive layer and the second conductive layer; a third conductive layer provided between the first conductive layer and the variable resistance layer; a nonlinear layer provided between the first conductive layer and the third conductive layer; and a first insulating layer provided at least between the first conductive layer and the nonlinear layer or between the third conductive layer and the nonlinear layer. The first insulating layer includes nitrogen (N) and boron (B).

According to another embodiment, a semiconductor storage device includes: a first conductive layer; a second conductive layer apart from the first conductive layer in a first direction; a variable resistance layer provided between the first conductive layer and the second conductive layer; a third conductive layer provided between the first conductive layer and the variable resistance layer; a nonlinear layer provided between the first conductive layer and the third conductive layer; and a first insulating layer provided at least between the first conductive layer and the nonlinear layer or between the third conductive layer and the nonlinear layer. The first insulating layer has a crystal with a hexagonal structure and the (0001) plane of this crystal intersects with the first direction.

Next, a semiconductor storage device according to an embodiment will be described in detail with reference to the drawings. The following embodiment is only an example and is not intended for limitation.

Moreover, in the present specification, a predetermined direction parallel to the front surface of a substrate is referred to as an X direction, a direction parallel to the front surface of the substrate and perpendicular to the X direction is referred to as a Y direction, and a direction perpendicular to the front surface of the substrate is referred to as a Z direction.

Furthermore, in the present specification, a direction along a predetermined surface is sometimes referred to as a first direction, a direction intersecting with the first direction along the predetermined surface is sometimes referred to as a second direction, and a direction intersecting with the predetermined surface is sometimes referred to as a third direction. Each of these first direction, second direction, and third direction may or may not correspond to any one of the X direction, the Y direction, and the Z direction.

Moreover, in the present specification, expressions such as "above" and "below" are based on the substrate. For instance, when the first direction intersects with the front surface of the substrate, a direction in which something moves away from the substrate in the first direction is referred to as above and a direction in which something moves close to the substrate in the first direction is referred to as below. Furthermore, as for a lower surface and a lower end of a certain constituent element, the lower surface and the lower end are assumed to mean a surface and an end of this constituent element which are located on the side close to the substrate; as for an upper surface and an upper end of this constituent element, the upper surface and the upper end are assumed to mean a surface and an end of this constituent element which are located on the side opposite to the substrate. Moreover, a surface intersecting with the second direction or the third direction is referred to as a side surface or the like.

In addition, in the present specification, when a first constituent element is "electrically connected" to a second constituent element, the first constituent element may be directly connected to the second constituent element or the first constituent element may be connected to the second constituent element via an interconnection, a semiconductor component, a transistor, or the like. For example, when three transistors are connected in series, even when the second transistor is in an OFF state, the first transistor is "electrically connected" to the third transistor.

Moreover, in the present specification, when a first constituent element is "electrically insulated" from a second constituent element, this state is assumed to mean, for instance, a state in which an insulating film or the like is provided between the first constituent element and the second constituent element and a contact, an interconnection, or the like which connects the first constituent element and the second constituent element is not provided.

Furthermore, in the present specification, when a circuit or the like "brings", for example, two interconnections "into conduction", this state sometimes means, for instance, a state in which this circuit or the like includes a transistor or the like, this transistor or the like is provided in a current path between the two interconnections, and this transistor or the like enters an ON state.

Hereinafter, the configuration of the semiconductor storage device according to the embodiment will be described with reference to the drawings. The drawings in the following description are schematic drawings and some constituent elements are sometimes omitted for the sake of explanation.

First Embodiment

[Schematic Configuration]

Figure 1:
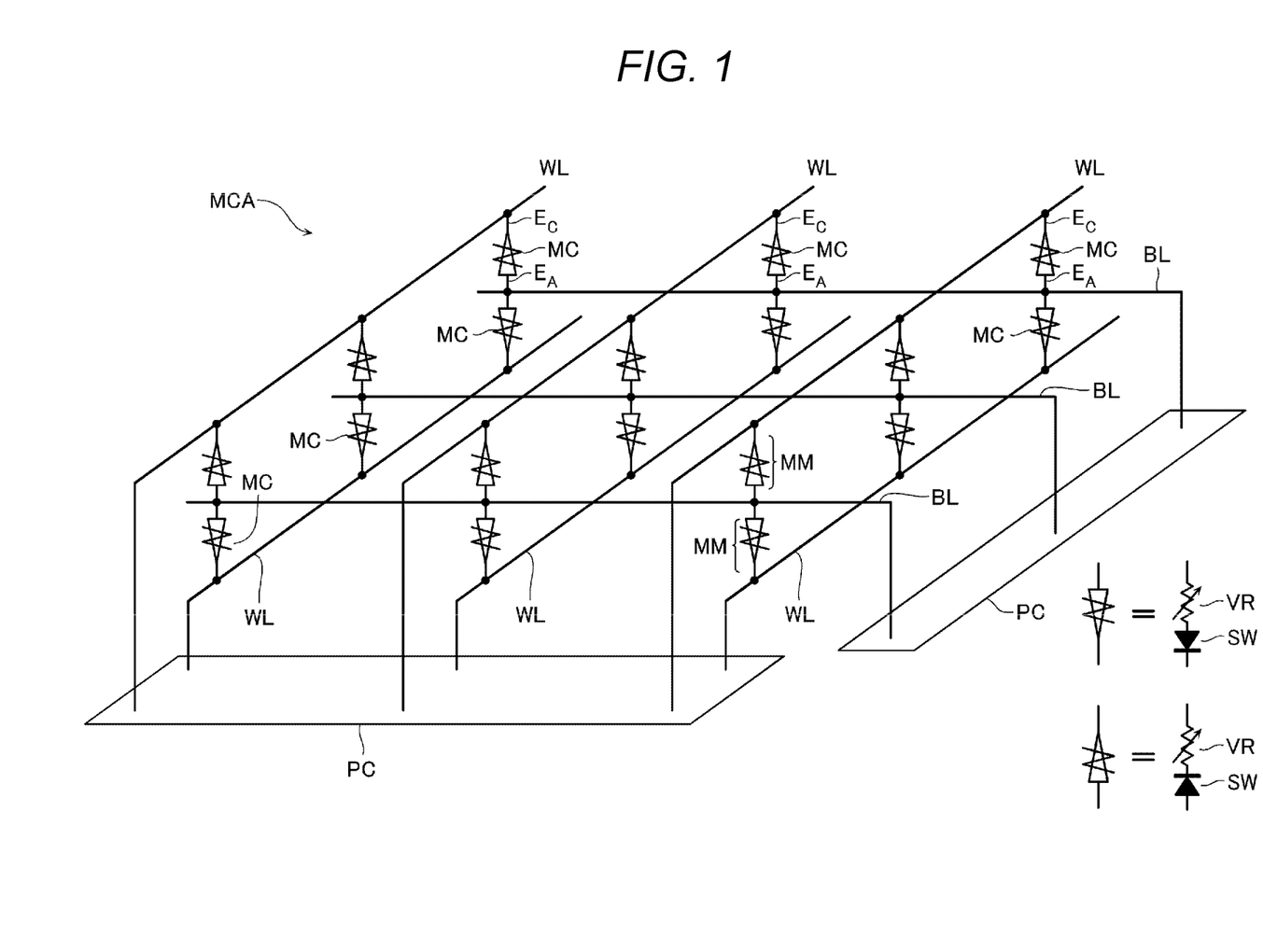
FIG. 1 is a schematic circuit diagram depicting the configuration of part of a semiconductor storage device according to a first embodiment.
Figure 2:
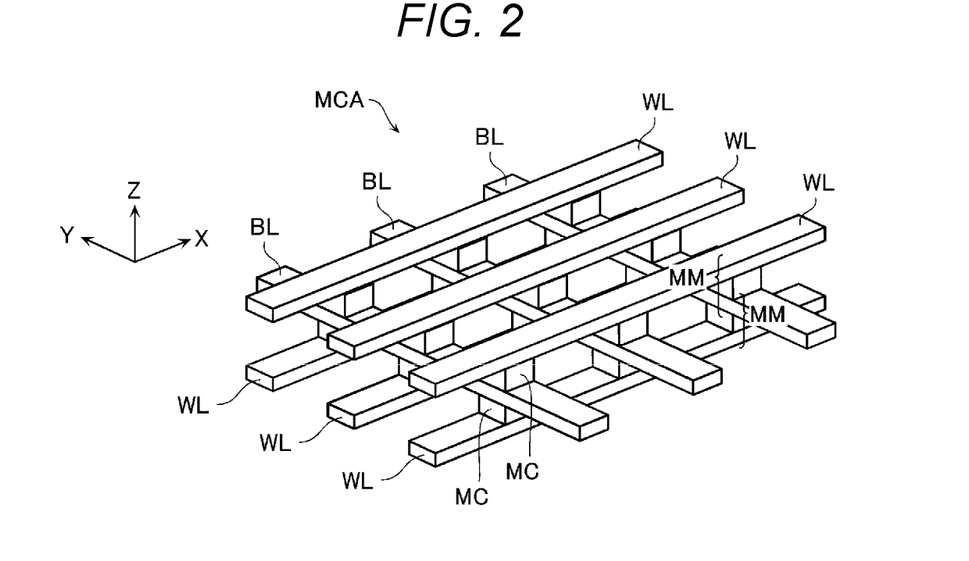
FIG. 2 is a schematic perspective view depicting the configuration of part of the semiconductor storage device.

FIG. 1 is a schematic circuit diagram depicting the configuration of part of a semiconductor storage device according to a first embodiment. FIG. 2 is a schematic perspective view depicting the configuration of part of the semiconductor storage device.

The semiconductor storage device according to the present embodiment includes a memory cell array MCA and a peripheral circuit PC that controls the memory cell array MCA.

The memory cell array MCA includes, as depicted in FIG. 2, for example, a plurality of memory mats MM arranged in the Z direction. The memory mats MM include a plurality of bit lines BL that are arranged in the X direction and extend in the Y direction, a plurality of word lines WL that are arranged in the Y direction and extend in the X direction, and a plurality of memory cells MC that are arranged in the X direction and the Y direction corresponding to the bit lines BL and the word lines WL. As depicted in FIG. 2, for two memory mats MM arranged in the Z direction, a common bit line BL or word line WL may be provided. In the example of FIG. 1, a cathode $E_C$ of the memory cell MC is connected to the word line WL. Moreover, an anode $E_A$ of the memory cell MC is connected to the bit line BL. The memory cell MC includes a variable resistance element VR and a switching element SW.

The peripheral circuit PC is connected to the bit lines BL and the word lines WL. The peripheral circuit PC includes, for example, a step-up circuit, such as a charge pump circuit, which steps up a power-supply voltage and outputs the voltage to a voltage supply line, a step-down circuit which steps down a power-supply voltage or the like and outputs the voltage to a voltage supply line, a selection circuit that brings the bit line BL and the word line WL corresponding to a selection address and a corresponding voltage supply line into conduction, a sense amplifier circuit that outputs data of 0 or 1 in accordance with the voltage or current of the bit line BL, a sequencer that controls these circuits, and so forth.

[Configuration of the Memory Cell MC]

Figure 3:
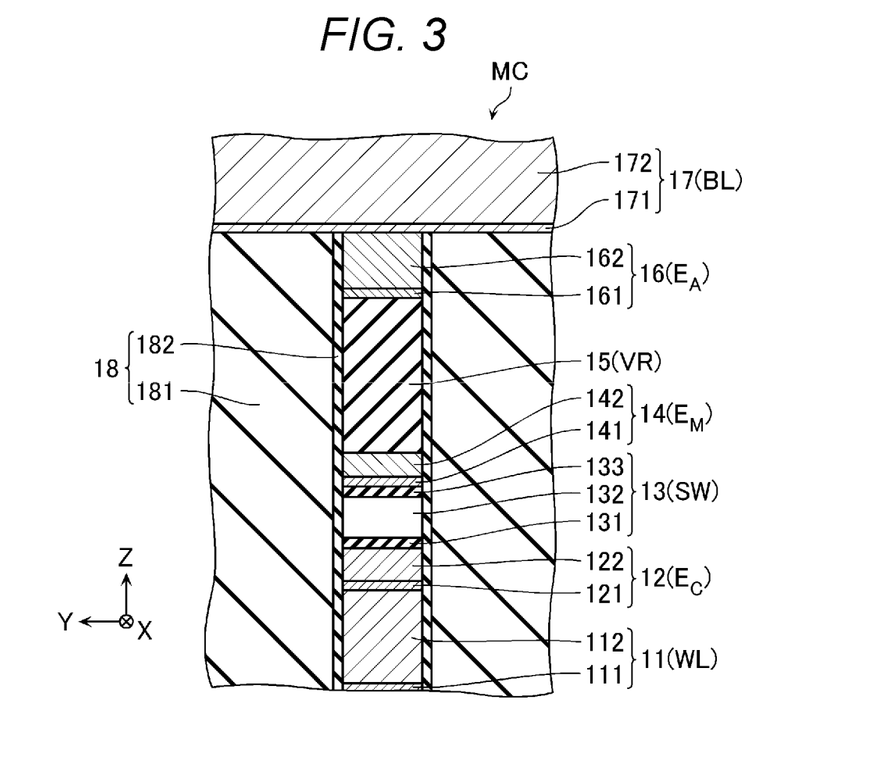
FIG. 3 is a schematic sectional view of a memory cell.

FIG. 3 is a schematic sectional view of the memory cell MC according to the present embodiment. In FIG. 3, the memory cell MC below which the word line WL is provided and above which the bit line BL is provided is illustrated. The memory cell MC below which the bit line BL is provided and above which the word line WL is provided also has roughly the same structure as the structure illustrated in FIG. 3.

In FIG. 3, a conductive layer 11, a conductive layer 12, a switching layer 13, a conductive layer 14, a variable resistance layer 15, a conductive layer 16, and a conductive layer 17, which are stacked in order in the Z direction, are depicted. Moreover, in FIG. 3, an insulating layer 18 that covers the side surfaces of the memory cell MC is depicted.

The conductive layer 11 functions as the word line WL which is provided immediately below the memory cell MC. The film configuration, material, and so forth of the conductive layer 11 may be changed as appropriate. In the example depicted in FIG. 3, the conductive layer 11 includes a barrier metal layer 111 such as titanium nitride (TiN) and a metal layer 112 such as tungsten (W).

The conductive layer 12 functions as the cathode $E_C$ of the memory cell MC. The film configuration, material, and so forth of the conductive layer 12 may be changed as appropriate. In the example depicted in FIG. 3, the conductive layer 12 includes a barrier metal layer 121 such as titanium nitride (TiN) and a metal layer 122 such as tungsten (W).

The switching layer 13 functions as the switching element SW. The switching layer 13 includes an insulating layer 131, a nonlinear layer 132, and an insulating layer 133.

The insulating layer 131 and the insulating layer 133 include hexagonal boron nitride (hBN), for example. Moreover, the (0001) plane of hexagonal boron nitride contained in the insulating layer 131 and the insulating layer 133 intersects with the Z direction. Furthermore, the insulating layer 131 and the insulating layer 133 can each have a thickness thin enough to allow a tunnel current to pass therethrough. For instance, the thickness of the insulating layer 131 and the insulating layer 133 in the Z direction may be less than or equal to 5 nanometers (nm). It is appreciated that a hexagonal structure of the insulating layer 131 and the insulating layer 133 can be observed by a transmission electron microscope (TEM) or the like.

The nonlinear layer 132 includes, for example, at least one or more types of chalcogens. The nonlinear layer 132 may include, for instance, chalcogenide which is a compound containing a chalcogen. Moreover, the nonlinear layer 132 may include at least one type of element selected from a group composed of B, Al, Ga, In, C, Si, Ge, Sn, As, P, and Sb.

The chalcogens here refer to elements, other than oxygen (O), which belong to Group 16 of the periodic table. The chalcogens include, for example, sulfur (S), selenium (Se), tellurium (Te), and the like.

When a voltage which is lower than a predetermined threshold voltage is applied to the nonlinear layer 132, the nonlinear layer 132 is in a high resistance state. When the voltage which is applied to the nonlinear layer 132 reaches the predetermined threshold voltage, the nonlinear layer 132 enters a low resistance state and the current flowing through the nonlinear layer 132 increases by one or more orders of magnitude. When the voltage which is applied to the nonlinear layer 132 falls below a predetermined voltage, the nonlinear layer 132 enters the high resistance state again.

The conductive layer 14 functions as an intermediate electrode ($E_M$) that connects the switching element SW and the variable resistance element VR. The film configuration, material, and so forth of the conductive layer 14 may be changed as appropriate. In the example depicted in FIG. 3, the conductive layer 14 includes a barrier metal layer 141 such as titanium nitride (TiN) and a metal layer 142 such as tungsten (W).

The variable resistance layer 15 functions as the variable resistance element VR. The variable resistance layer includes, for example, a crystalline region and a phase-change region. The phase-change region enters an amorphous state (a reset state: a high resistance state) by heating that is performed at a melting temperature or above and rapid cooling. Moreover, the phase-change region enters a crystalline state (a set state: a low resistance state) by overheating that is performed at a temperature, which is lower than the melting temperature and higher than a crystallization temperature, and gradual cooling.

The variable resistance layer 15 includes, for example, at least one or more types of chalcogens. The variable resistance layer 15 may include, for instance, chalcogenide which is a compound including a chalcogen. The variable resistance layer 15 may be, for example, GeSbTe, GeTe, SbTe, SiTe, or the like. Moreover, the variable resistance layer 15 may include at least one type of element selected from germanium (Ge), antimony (Sb), and tellurium (Te). The following description deals with an example in which the variable resistance layer 15 includes GeSbTe.

The conductive layer 16 functions as the anode $E_A$ of the memory cell MC. The film configuration, material, and so forth of the conductive layer 16 may be changed as appropriate. In the example depicted in FIG. 3, the conductive layer 16 includes a barrier metal layer 161 such as titanium nitride (TiN) and a metal layer 162 such as tungsten (W).

The conductive layer 17 functions as the bit line BL which is provided immediately above the memory cell MC. The film configuration, material, and so forth of the conductive layer 17 may be changed as appropriate. In the example depicted in FIG. 3, the conductive layer 17 includes a barrier metal layer 171 such as titanium nitride (TiN) and a metal layer 172 such as tungsten (W).

The insulating layer 18 is provided between the word line WL and the memory cell MC which are adjacent to each other in the Y direction and between the bit line BL and the memory cell MC which are adjacent to each other in the X direction (see FIG. 2). The insulating layer 18 includes, for example, a barrier insulating film 182 such as silicon nitride ($Si_3N_4$) and an insulating film 181 such as silicon oxide ($SiO_2$). The barrier insulating film 182 is provided, for instance, on the side surface of the word line WL in the Y direction and the upper surface of the word line WL, the side surfaces of the memory cell MC in the X direction and the Y direction, and the side surface of the bit line BL in the X direction and the upper surface of the bit line BL.

[Electrical Characteristics of the Memory Cell MC]

Figure 4:
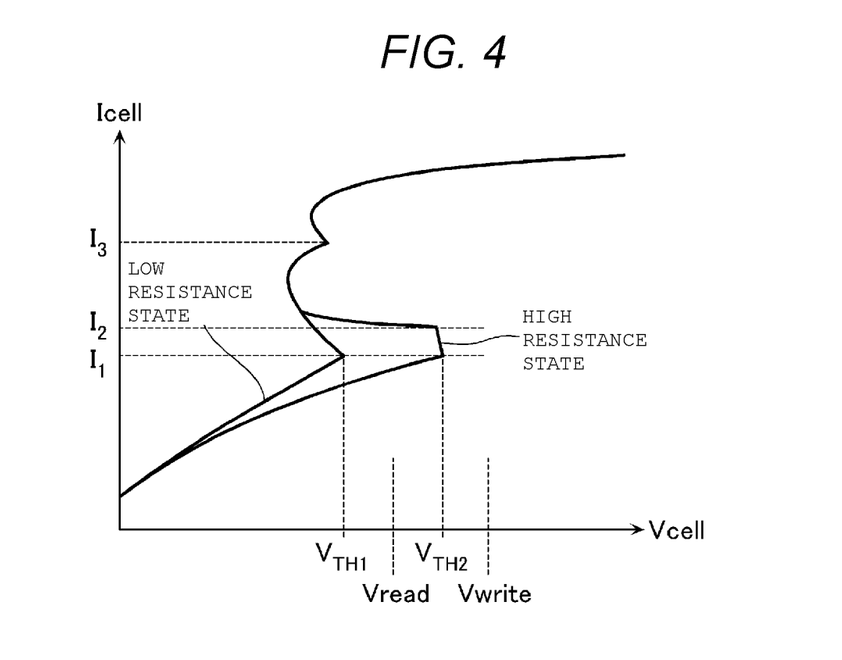
FIG. 4 is a schematic graph showing the current-voltage characteristics of the memory cell.

FIG. 4 is a schematic graph showing the current-voltage characteristics of the memory cell MC according to the present embodiment. The horizontal axis represents a cell voltage Vcell which is a voltage difference between the cathode $E_C$ and the anode $E_A$ of the memory cell MC. The vertical axis represents, as a logarithmic axis, a cell current Icell which flows through the memory cell MC.

In a range in which the cell current Icell is smaller than a predetermined current value $I_1$, the cell voltage Vcell monotonously increases with an increase in the cell current Icell. When the cell current Icell reaches the predetermined current value $I_1$, the cell voltage Vcell of the memory cell MC, which is in the low resistance state, reaches a threshold voltage $V_{TH1}$. Moreover, the cell voltage Vcell of the memory cell MC, which is in the high resistance state, reaches a threshold voltage $V_{TH2}$. The threshold voltage $V_{TH2}$ is higher than the threshold voltage $V_{TH1}$.

In a range in which the cell current Icell is larger than the current value $I_1$ and smaller than a current value $I_2$, the cell voltage Vcell monotonously decreases with increasing cell current Icell. In this range, the cell voltage Vcell of the memory cell MC in the high resistance state is higher than the cell voltage Vcell of the memory cell MC in the low resistance state.

In a range in which the cell current Icell is larger than the current value $I_2$ and smaller than a current value $I_3$, the cell voltage Vcell temporarily decreases with an increase in the cell current Icell and then increases. In this range, the cell voltage Vcell of the memory cell MC in the high resistance state suddenly decreases with an increase in the cell current Icell and becomes nearly equal to the cell voltage Vcell of the memory cell MC in the low resistance state.

In a range in which the cell current Icell is larger than the current value $I_3$, the cell voltage Vcell temporarily decreases with an increase in the cell current Icell and then increases.

From this state, if the cell current Icell is rapidly decreased to a magnitude which is smaller than the current value $I_1$, the switching layer 13 enters the high resistance state. Moreover, if the cell current Icell is decreased to a predetermined magnitude, this state is maintained for a fixed time, and the cell current Icell is then decreased to a magnitude which is smaller than the current value $I_1$, the switching layer 13 enters the low resistance state.

[Operation]

At the time of a write operation, first, for example, the cell voltage Vcell is adjusted to a write voltage Vwrite which is higher than the threshold voltage $V_{TH2}$. Next, if the memory cell MC needs to be brought to the high resistance state, the cell voltage Vcell is decreased to 0 V within a predetermined time, for instance. On the other hand, if the memory cell MC needs to be brought to the low resistance state, for example, in a state in which the cell voltage Vcell is decreased to a predetermined voltage, the state is maintained for a fixed period, and the cell voltage Vcell is then adjusted to 0 V.

At the time of a read operation, for example, the cell voltage Vcell is set at a read voltage Vread which is higher than the threshold voltage $V_{TH1}$ and lower than the threshold voltage $V_{TH2}$. Detection is performed to determine whether or not the cell current Icell in this state is larger than a threshold. The threshold may be set so as to be larger than or equal to the current value $I_1$, for example.

[The Insulating Layer 131 and the Insulating Layer 133]

Figure 5:
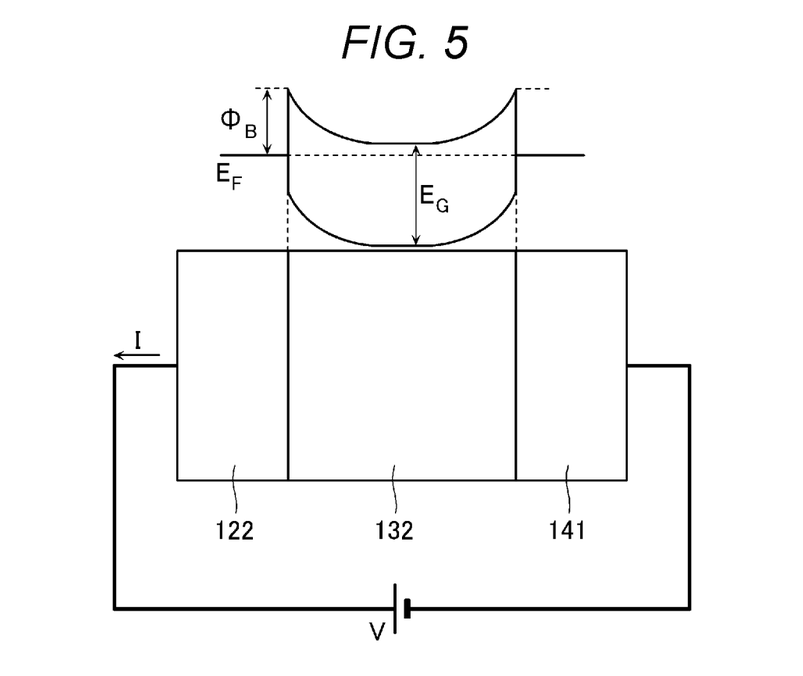
FIG. 5 is a schematic diagram for illustrating an insulating layer 131 and an insulating layer 133.
Figure 6:
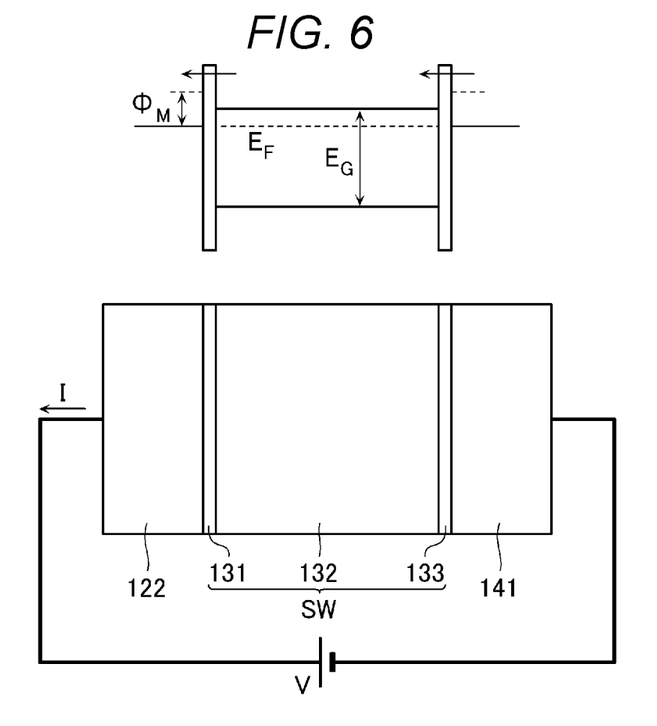
FIG. 6 is a schematic diagram for illustrating the insulating layer 131 and the insulating layer 133.

FIGS. 5 and 6 are schematic diagrams for illustrating the insulating layer 131 and the insulating layer 133. In FIG. 5, for the sake of comparison, a structure without the insulating layer 131 and the insulating layer 133 is illustrated. In FIG. 6, a structure with the insulating layer 131 and the insulating layer 133 is illustrated.

In FIG. 5, the metal layer 122, the nonlinear layer 132 provided on this metal layer 122, and the barrier metal layer 141 provided on this nonlinear layer 132 are illustrated.

Moreover, in FIG. 5, a schematic energy band diagram corresponding to each layer is illustrated. In FIG. 5, $E_F$ denotes the Fermi level, $E_G$ denotes the energy gap between a valence band and a conduction band in the nonlinear layer 132, and $\Phi_B$ denotes a Schottky barrier height above the Fermi level $E_F$.

As depicted in FIG. 5, a junction between the nonlinear layer 132 and the metal layer 122 and a junction between the nonlinear layer 132 and the barrier metal layer 141 may be Schottky junctions. A cause of the generation of a Schottky junction is a coupling between dangling bonds of the metal layer 122 and the nonlinear layer 132. If a Schottky junction is generated, due to contact resistance between the nonlinear layer 132 and the metal layer 122 and between the nonlinear layer 132 and the barrier metal layer 141, the threshold voltage $V_{TH1}$ of FIG. 4 sometimes becomes higher.

In FIG. 6, the metal layer 122, the insulating layer 131 provided on this metal layer 122, the nonlinear layer 132 provided on this insulating layer 131, the insulating layer 133 provided on this nonlinear layer 132, and the barrier metal layer 141 provided on this insulating layer 133 are illustrated.

Moreover, in FIG. 6, a schematic energy band diagram corresponding to each layer is illustrated. Reference signs in FIG. 6 are roughly similar to the reference signs depicted in FIG. 5.

Compared to the structure depicted in FIG. 5, in the structure depicted in FIG. 6, a Schottky junction is less easily generated because the insulating layer 131 is provided between the metal layer 122 and the nonlinear layer 132 and the insulating layer 133 is provided between the barrier metal layer 141 and the nonlinear layer 132.

That is, the insulating layer 131 and the insulating layer 133 include, for example, hexagonal boron nitride (hBN) whose (0001) plane intersects with the Z direction. Hexagonal boron nitride has a hexagonal structure and has almost no dangling bonds due to strong coupling on the (0001) plane. Thus, there is almost no coupling between dangling bonds of the insulating layer 131 and the nonlinear layer 132 and between dangling bonds of the insulating layer 133 and the nonlinear layer 132.

Therefore, according to such a configuration, the threshold voltage $V_{TH1}$ of FIG. 4 can be suitably controlled.

[The Relationship Between the Switching Element SW and the Conductive Layers 12 and 14]

As described above with reference to FIG. 6, in the semiconductor storage device according to the present embodiment, the generation of a Schottky junction in the nonlinear layer 132 is prevented. As such, a difference between the work functions of the conductive layers 12 and 14 and the work function of the nonlinear layer 132 in the conduction band thereof greatly influences the threshold voltage $V_{TH1}$ of FIG. 4. Thus, by selecting the materials of the conductive layers 12 and 14, the threshold voltage $V_{TH1}$ of FIG. 4 can be suitably controlled.

For example, when the nonlinear layer 132 functions as an N-type switching element SW using electrons as carriers, the larger the work functions of the conductive layers 12 and 14, the lower the threshold voltage $V_{TH1}$. On the other hand, when the nonlinear layer 132 functions as a P-type switching element SW using positive holes as carriers, the larger the work functions of the conductive layers 12 and 14, the higher the threshold voltage $V_{TH1}$.

As the materials of the conductive layers 12 and 14, various materials may be used. For instance, as a material with a work function of about 3.5 electronvolts (eV), scandium (Sc) may be used. As a material with a work function of about 4.7 eV, copper (Cu) may be used. As a material with a work function of about 5.0 eV, cobalt (Co) may be used. As a material with a work function of about 5.2 eV, nickel (Ni) may be used. As a material with a work function of about 5.7 eV, platinum (Pt) may be used, and. As a material with a work function of about 6.6 eV, molybdenum trioxide ($MoO_3$) may be used. As a material with a work function of about 4.2 eV, one of silver (Ag), aluminum (Al), and titanium (Ti) may be used. As a material with a work function of about 5.1 eV, palladium (Pd) may be used.

Moreover, as the material of the insulating layer 131 and the insulating layer 133, in addition to hexagonal boron nitride (hBN), other insulating materials with a hexagonal structure, such as hexagonal aluminum nitride (hAlN) or hexagonal gallium nitride (hGaN), may also be used.

When hexagonal boron nitride (hBN), hexagonal aluminum nitride (hAlN), or hexagonal gallium nitride (hGaN) is used, the threshold voltage $V_{TH1}$ decreases in proportion to the work functions of the materials of the conductive layers 12 and 14. Moreover, when hexagonal boron nitride (hBN) is used, a correlation between the work functions of the materials of the conductive layers 12 and 14 and the threshold voltage $V_{TH1}$ is higher than a correlation that is observed when hexagonal aluminum nitride (hAlN) or hexagonal gallium nitride (hGaN) is used.

Other Embodiments

In the first embodiment, as the variable resistance layer 15 in the memory cell MC, the variable resistance layer 15 including a chalcogen is illustrated. However, as the variable resistance layer 15 in the memory cell MC, other variable resistance layers may also be used. For example, the variable resistance layer 15 may be a magnetoresistive layer including a magnetization free layer, a magnetization fixed layer, and a tunnel insulating film, such as magnesium oxide (MgO), which is provided between the magnetization free layer and the magnetization fixed layer. Moreover, the variable resistance layer 15 may be a layer that includes an insulating layer such as a metal oxide and can generate, in this insulating layer, a filament such as a metal ion or an oxygen defect.

Moreover, in the first embodiment, as the nonlinear layer 132 in the memory cell MC, the nonlinear layer 132 including a chalcogen is illustrated. However, as the nonlinear layer 132 in the memory cell MC, other layers may also be used.

Furthermore, in the first embodiment, the insulating layer 131 is provided between the metal layer 122 and the nonlinear layer 132 and the insulating layer 133 is provided between the barrier metal layer 141 and the nonlinear layer 132. However, for example, one of the insulating layer 131 and the insulating layer 133 may be omitted.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor storage device comprising:
   a first conductive layer;
   a second conductive layer apart from the first conductive layer in a first direction;
   a variable resistance layer provided between the first conductive layer and the second conductive layer;
   a third conductive layer provided between the first conductive layer and the variable resistance layer;
   a nonlinear layer provided between the first conductive layer and the third conductive layer; and
   a first insulating layer provided at least between the first conductive layer and the nonlinear layer or between the third conductive layer and the nonlinear layer,
   wherein
   the first insulating layer has a crystal with a hexagonal structure and a (0001) plane of this crystal intersects with the first direction.
2. The semiconductor storage device according to claim 1, wherein
   a thickness of the first insulating layer in the first direction is less than or equal to 5 nanometers(nm).

3. The semiconductor storage device according to claim 1, wherein
the nonlinear layer includes a chalcogen.

4. The semiconductor storage device according to claim 1, wherein
the first insulating layer is provided between the first conductive layer and the nonlinear layer and between the third conductive layer and the nonlinear layer.

5. The semiconductor storage device according to claim 1, wherein
the first insulating layer is in direct contact with the first conductive layer and the nonlinear layer.

6. The semiconductor storage device according to claim 1, wherein
the first insulating layer is in direct contact with the third conductive layer and the nonlinear layer.

7. The semiconductor storage device according to claim 1, wherein
the first insulating layer includes at least one of nitrogen or boron.

\* \* \* \* \*